US012777692B2

(12) United States Patent
Sasaki

(10) Patent No.: US 12,777,692 B2
(45) Date of Patent: Oct. 27, 2026

(54) SEMICONDUCTOR DEVICE AND METHOD FOR MANUFACTURING THE SAME

(71) Applicants: Kabushiki Kaisha Toshiba, Tokyo (JP); Toshiba Electronic Devices & Storage Corporation, Tokyo (JP)

(72) Inventor: Yuichiro Sasaki, Nonoichi Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 286 days.

(21) Appl. No.: 18/642,454

(22) Filed: Apr. 22, 2024

(65) Prior Publication Data

US 2025/0098246 A1 Mar. 20, 2025

(30) Foreign Application Priority Data

Sep. 19, 2023 (JP) ................................ 2023-151598

(51) Int. Cl.
*H10D 62/13* (2025.01)
*H10D 30/01* (2025.01)
(Continued)

(52) U.S. Cl.
CPC ....... *H10D 62/153* (2025.01); *H10D 30/0295* (2025.01); *H10D 30/0297* (2025.01);
(Continued)

(58) Field of Classification Search
CPC ............. H10D 62/153; H10D 30/0295; H10D 30/0297; H10D 30/668; H10D 64/252;
(Continued)

(56) References Cited

U.S. PATENT DOCUMENTS 10,304,954 B2 * 5/2019 Kobayashi ........... H10D 30/668
11,043,586 B2 6/2021 Kyogoku et al.
(Continued)

FOREIGN PATENT DOCUMENTS

JP 2012-049573 A 3/2012
JP 2018-110166 A 7/2018
(Continued)

OTHER PUBLICATIONS

Notice of Reasons for Refusal (Office Action) dated Jul. 31, 2026, mailed in counterpart Japanese Patent Application No. 2023-151598, with English machine translation, 13 pages.

*Primary Examiner* — J. E. Schoenholtz
(74) *Attorney, Agent, or Firm* — Kim & Stewart LLP

(57) ABSTRACT

According to one embodiment, a semiconductor device includes a first electrode, a first semiconductor region of a first conductivity type, a gate electrode, a second semiconductor region of a second conductivity type, a third semiconductor region of the first conductivity type, and a second electrode. The gate electrode is located on the first semiconductor region with a gate insulating layer interposed. The second semiconductor region faces the gate electrode via the gate insulating layer. The second semiconductor region includes: a first portion; a second portion located on the first portion and having a higher second-conductivity-type impurity concentration than the first portion; and a third portion positioned between the second portion and the gate electrode and having a higher concentration of a first element than the second portion. The first element is at least one selected from the group consisting of carbon, germanium, antimony, and indium.

8 Claims, 8 Drawing Sheets

(51) Int. Cl.

| | |
|---|---|
| ***H10D 30/66*** | (2025.01) |
| ***H10D 64/23*** | (2025.01) |
| ***H10P 30/20*** | (2026.01) |

(52) U.S. Cl.
CPC ......... *H10D 30/668* (2025.01); *H10D 64/252* (2025.01); *H10P 30/204* (2026.01); *H10P 30/21* (2026.01); *H10P 30/222* (2026.01)

(58) Field of Classification Search
CPC .. H10D 12/481; H10D 64/2527; H10D 64/62; H10D 62/393; H10P 30/204; H10P 30/21; H10P 30/222; H10P 30/221
See application file for complete search history.

(56) References Cited

U.S. PATENT DOCUMENTS

| | | | | |
|---|---|---|---|---|
| 11,069,803 | B2 | 7/2021 | Tanaka et al. | |
| 11,626,514 | B2 * | 4/2023 | Kishimoto ........... | H10D 62/155 257/330 |
| 2007/0093019 | A1 | 4/2007 | Rieger et al. | |
| 2014/0151788 | A1 | 6/2014 | Burke et al. | |
| 2018/0175147 | A1 * | 6/2018 | Ohse .................... | H10D 62/299 |
| 2021/0296489 | A1 * | 9/2021 | Kishimoto ........... | H10D 64/256 |
| 2022/0013640 | A1 | 1/2022 | Tanaka et al. | |
| 2024/0097025 | A1 * | 3/2024 | Kinoshita ............ | H10D 62/107 |

FOREIGN PATENT DOCUMENTS

| | | | |
|---|---|---|---|
| JP | 2021-044516 | A | 3/2021 |
| JP | 2021-044518 | A | 3/2021 |
| JP | 2021-170609 | A | 10/2021 |
| JP | 2022-015727 | A | 1/2022 |

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2023-151598, filed on Sep. 19, 2023; the entire contents of which are incorporated herein by reference.

FIELD

Embodiments of the invention generally relate to a semiconductor device and a method for manufacturing the same.

BACKGROUND

Semiconductor devices such as metal oxide semiconductor field effect transistors (MOSFETs), insulated gate bipolar transistors (IGBTs), and the like are used in applications such as power conversion. It is desirable for the characteristic fluctuation between semiconductor devices to be small.

DETAILED DESCRIPTION

Figure 1:
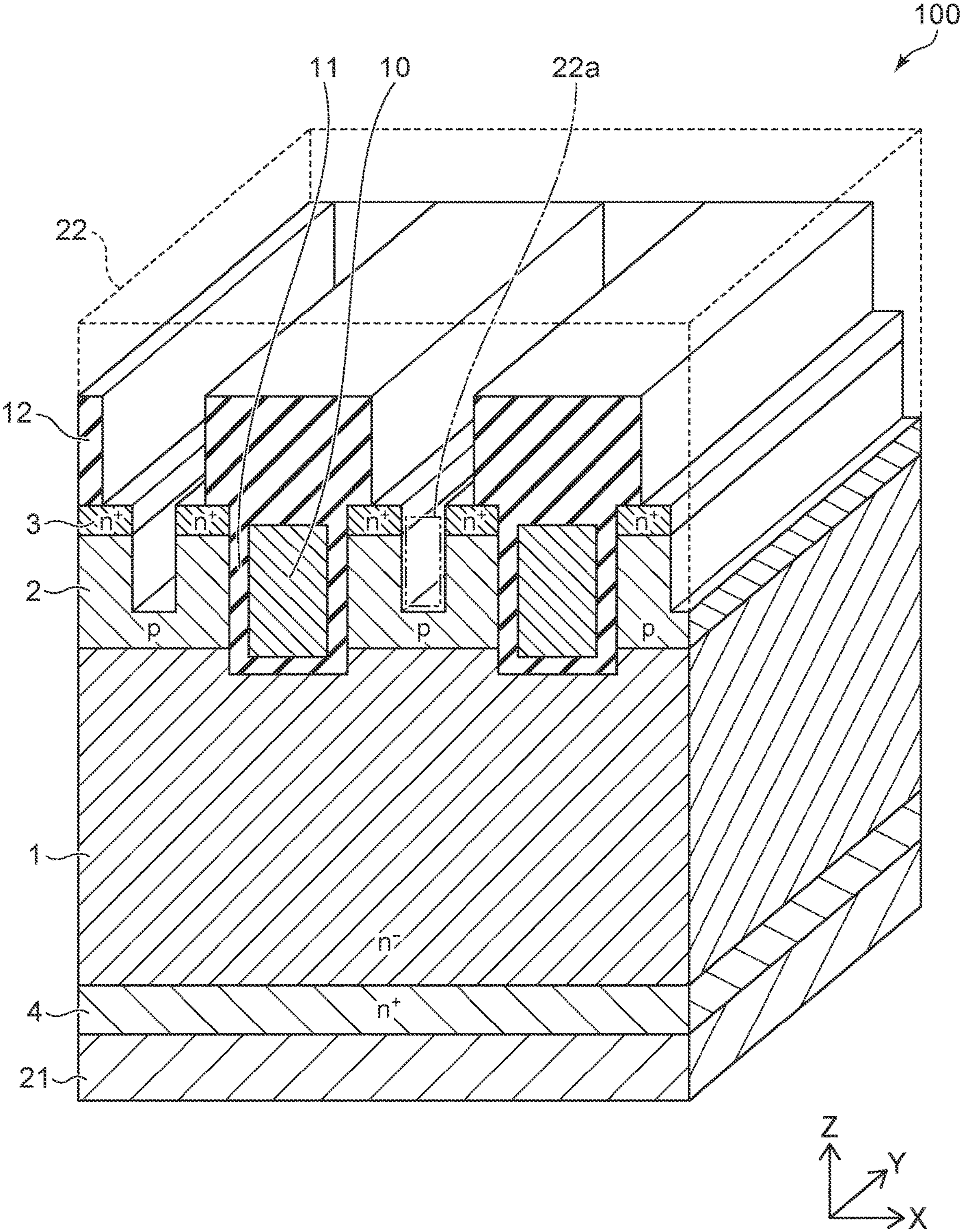
FIG. 1 is a perspective cross-sectional view showing a portion of a semiconductor device according to an embodiment.

According to one embodiment, a semiconductor device includes a first electrode, a first semiconductor region of a first conductivity type, a gate electrode, a second semiconductor region of a second conductivity type, a third semiconductor region of the first conductivity type, and a second electrode. The first semiconductor region is located on the first electrode, and is electrically connected with the first electrode. The gate electrode is located on the first semiconductor region with a gate insulating layer interposed. The second semiconductor region faces the gate electrode via the gate insulating layer in a second direction perpendicular to a first direction that is from the first electrode toward the first semiconductor region. The second semiconductor region includes a first portion, a second portion, and a third portion.

The second portion is located on the first portion and has a higher second-conductivity-type impurity concentration than the first portion. The third portion is positioned between the second portion and the gate electrode in the second direction and has a higher concentration of a first element than the second portion. The first element is at least one selected from the group consisting of carbon, germanium, antimony, and indium. The third semiconductor region is located on the second semiconductor region. The second electrode is electrically connected with the second and third semiconductor regions, and includes a contact part arranged with the third semiconductor region in the second direction and located on the second portion.

Various embodiments will be described hereinafter with reference to the accompanying drawings. The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions. In the specification and drawings, components similar to those described or illustrated in a drawing thereinabove are marked with like reference numerals, and a detailed description is omitted as appropriate.

In the following description, the notations of $n^+$, n, $n^-$, $p^+$, and p indicate relative levels of the impurity concentrations of the conductivity types. Namely, $n^+$ indicates that the n-type impurity concentration is relatively higher than that of n; and $n^-$ indicates that the n-type impurity concentration is relatively lower than that of n. Also, $p^+$ indicates that the p-type impurity concentration is relatively higher than that of p. According to the embodiments described below, each embodiment may be implemented by inverting the p-type and the n-type of the semiconductor regions.

FIG. 1 is a perspective cross-sectional view showing a portion of a semiconductor device according to an embodiment.

The semiconductor device 100 according to the embodiment shown in FIG. 1 is a MOSFET. The semiconductor device 100 includes an $n^-$-type (first-conductivity-type) drift region 1 (a first semiconductor region), a p-type (second-conductivity-type) base region 2 (a second semiconductor region), an $n^+$-type source region 3 (a third semiconductor region), an $n^+$-type drain region 4, a gate electrode 10, a gate insulating layer 11, an insulating layer 12, a lower electrode 21 (a first electrode), and an upper electrode 22 (a second electrode). In FIG. 1, the upper electrode 22 is illustrated by a broken line.

An XYZ orthogonal coordinate system is used in the description of embodiments. The direction from the lower electrode 21 toward the $n^-$-type drift region 1 is taken as a Z-direction (a first direction). Two mutually-orthogonal directions perpendicular to the Z-direction are taken as an X-direction (a second direction) and a Y-direction (a third direction). In the description, the direction from the lower electrode 21 toward the $n^-$-type drift region 1 is called "up/upward/higher than", and the opposite direction is called "down/downward/lower than". These directions are based on the relative positional relationship between the lower electrode 21 and the $n^-$-type drift region 1, and are independent of the direction of gravity.

The lower electrode 21 is located at the lower surface of the semiconductor device 100. The $n^+$-type drain region 4 is located on the lower electrode 21, and is electrically connected with the lower electrode 21. The $n^-$-type drift region 1 is located on the $n^+$-type drain region 4. The $n^-$-type drift region 1 is electrically connected with the lower electrode 21 via the $n^+$-type drain region 4. The n-type impurity concentration of the $n^-$-type drift region 1 is less than the n-type impurity concentration of the $n^+$-type drain region 4.

The gate electrode 10 is located on the $n^-$-type drift region 1 with the gate insulating layer 11 interposed. The p-type base region 2 is located on the $n^-$-type drift region 1. The $n^+$-type source region 3 is located on the p-type base region 2. A portion of the $n^-$-type drift region 1, the p-type base region 2, and at least a portion of the $n^+$-type source region 3 face the gate electrode 10 via the gate insulating layer 11 in the X-direction.

The upper electrode 22 is located on the p-type base region 2 and the $n^+$-type source region 3, and is positioned at the upper surface of the semiconductor device 100. The upper electrode 22 includes a contact part 22*a*. The contact part 22*a* extends downward, and is arranged with the $n^+$-type source region 3 and a portion of the p-type base region 2 in the X-direction. The insulating layer 12 is located between the gate electrode 10 and the upper electrode 22; and the gate electrode 10 and the upper electrode 22 are electrically isolated from each other.

Pluralities of each of the p-type base region 2, the $n^+$-type source region 3, the gate electrode 10, and the contact part 22*a* are arranged in the X-direction. The p-type base region 2 is positioned between gate electrodes 10 adjacent to each other in the X-direction. The p-type base regions 2, the $n^+$-type source regions 3, the gate electrodes 10, and the contact parts 22*a* extend in the Y-direction.

Figure 2:
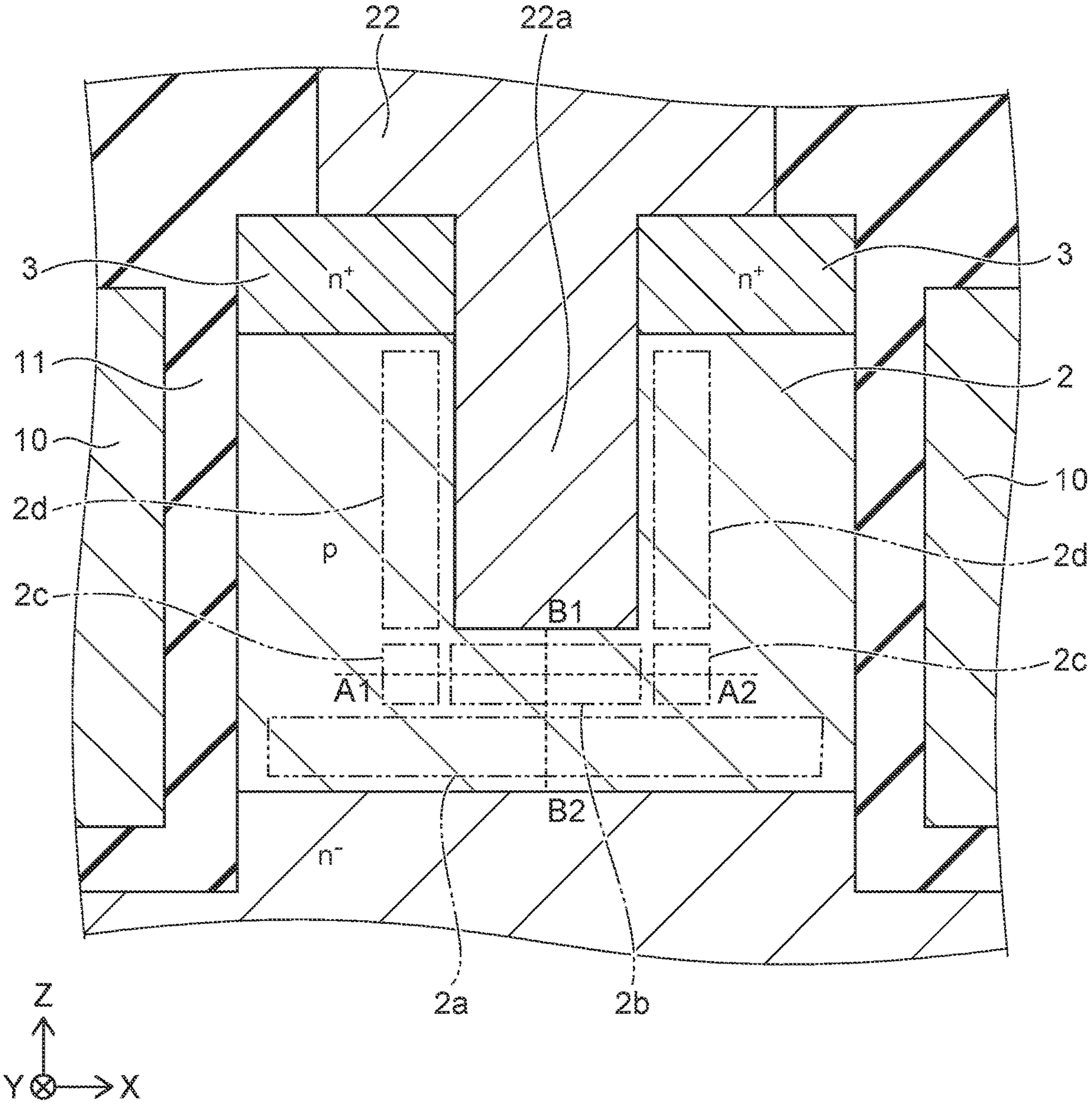
FIG. 2 is an enlarged cross-sectional view of a portion of FIG. 1.

FIG. 2 is an enlarged cross-sectional view of a portion of FIG. 1.

As shown in FIG. 2, the p-type base region 2 includes a first portion 2*a*, a second portion 2*b*, and a third portion 2*c*. The second portion 2*b* and the third portion 2*c* are located on the first portion 2*a*. The second portion 2*b* and the third portion 2*c* are arranged with each other in the X-direction. The contact part 22*a* is positioned on the second portion 2*b*. The third portion 2*c* is positioned between the second portion 2*b* and the gate electrode 10 in the X-direction.

The p-type impurity concentration in the second portion 2*b* and the p-type impurity concentration in the third portion 2*c* are greater than the p-type impurity concentration in the first portion 2*a*. The concentration of a first element in the third portion 2*c* is greater than the concentration of the first element in the second portion 2*b* and the concentration of the first element in the first portion 2*a*. The first element is at least one selected from the group consisting of carbon, germanium, antimony, and indium.

As shown in FIG. 2, the p-type base region 2 may further include a fourth portion 2*d*. The fourth portion 2*d* is positioned higher than the second portion 2*b* and the third portion 2*c*, and is arranged with the contact part 22*a* in the X-direction. The concentration of the first element in the fourth portion 2*d* is greater than the concentration of the first element in the second portion 2*b* and the concentration of the first element in the first portion 2*a*. The concentration of the first element in the fourth portion 2*d* may be equal to or different from the concentration of the first element in the third portion 2*c*. The p-type impurity concentration in the fourth portion 2*d* is less than the p-type impurity concentration in the second portion 2*b*.

In the illustrated example, the p-type base region 2 includes a pair of third portions 2*c* that are separated from each other, and a pair of fourth portions 2*d* that are separated from each other. The second portion 2*b* is positioned between the pair of third portions 2*c* in the X-direction. The contact part 22*a* is positioned between the pair of fourth portions 2*d* in the X-direction. The second portion 2*b* and the pair of fourth portions 2*d* contact the contact part 22*a*.

Figure 3:
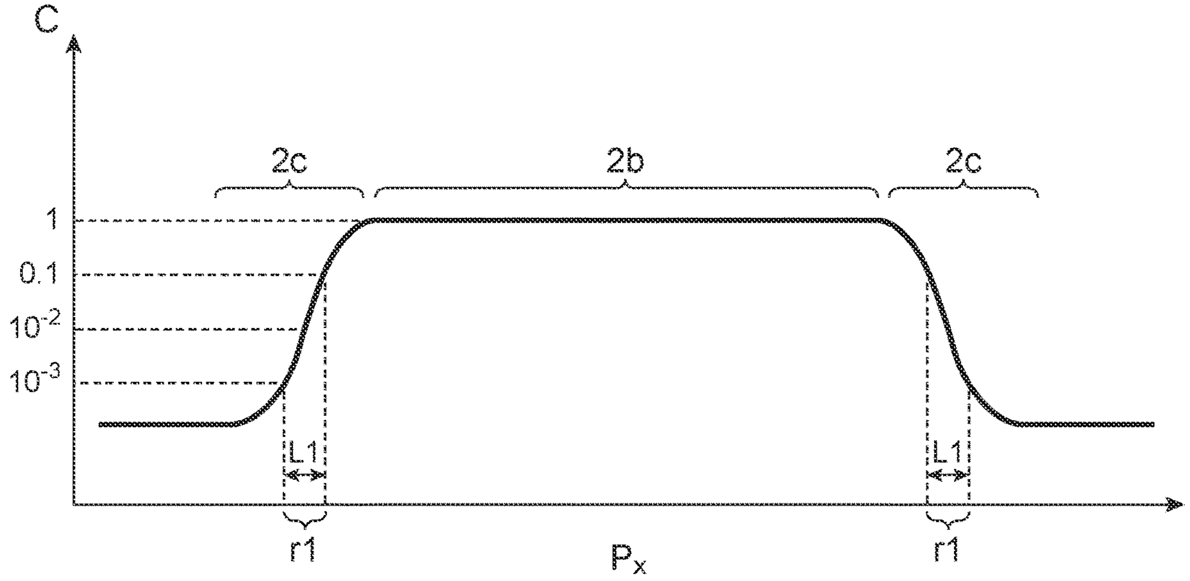
FIG. 3 is a graph illustrating characteristics of the semiconductor device according to the embodiment.
Figure 4:
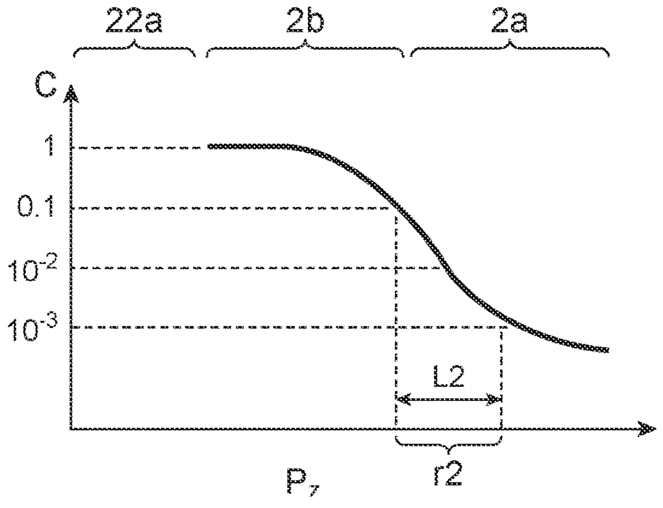
FIG. 4 is a graph illustrating characteristics of the semiconductor device according to the embodiment.

FIGS. 3 and 4 are graphs illustrating characteristics of the semiconductor device according to the embodiment.

FIG. 3 shows the p-type impurity concentration distribution along line A1-A2 of FIG. 2. FIG. 4 shows the p-type impurity concentration distribution along line B1-B2 of FIG. 2. In FIG. 3, the horizontal axis is a position $P_X$ in the X-direction, and the vertical axis is a p-type impurity concentration C (atoms/cm$^3$). In FIG. 4, the horizontal axis is a position $P_Z$ in the Z-direction, and the vertical axis is the p-type impurity concentration C (atoms/cm$^3$). Namely, FIG. 3 shows measurement results of the p-type impurity concentration of the second portion 2*b* and the third portion 2*c* along the X-direction. FIG. 4 shows measurement results of the p-type impurity concentration along the Z-direction from the interface between the second portion 2*b* and the contact part 22*a* toward the first portion 2*a*.

The maximum impurity concentration is taken as “1” in the concentration distributions shown in FIGS. 3 and 4. In the concentration distribution shown in FIG. 3, the region in which the impurity concentration is within the range of 0.1 times to 0.001 times the maximum value is taken as a first region r1. In the concentration distribution shown in FIG. 4, the region in which the impurity concentration is within the range of 0.1 times to 0.001 times the maximum value is taken as a second region r2. In such a case, a length L1 of the first region r1 is less than 0.5 times a length L2 of the second region r2. In other words, the spreading of the p-type impurity from the second portion 2*b* along the X-direction is less than the spreading of the p-type impurity from the second portion 2*b* along the Z-direction. For example, the length L1 is less than 0.5 times and greater than 0.1 times the length L2. The concentration of the first element in the first region r1 is greater than the concentration of the first element in the second region r2.

The concentrations of the p-type impurity and the first element in the components of the p-type base region 2 can be acquired by secondary ion mass spectrometry (SIMS) or atom probe. Or, the carrier densities of the components of the p-type base region 2 may be measured with a scanning capacitance microscope (SCM). The carrier density can be considered to be substantially equal to the impurity concentration of each component. Accordingly, the distribution of the carrier density in the p-type base region 2 can be used as the distribution of the p-type impurity concentration in the p-type base region 2.

Operations of the semiconductor device 100 will now be described.

A voltage that is not less than a threshold is applied to the gate electrode 10 in a state in which a positive voltage with respect to the upper electrode 22 is applied to the lower electrode 21. As a result, a channel (an inversion layer) is formed in the p-type base region 2; and the semiconductor device 100 is set to an on-state. Electrons flow from the upper electrode 22 toward the lower electrode 21 via the channel. When the voltage applied to the gate electrode 10 drops below the threshold, the channel in the p-type base region 2 disappears, and the semiconductor device 100 is set to an off-state.

Examples of the materials of the components will now be described.

The $n^-$-type drift region 1, the p-type base region 2, the $n^+$-type source region 3, and the $n^+$-type drain region 4 include single-crystal silicon as a semiconductor material. These semiconductor regions may include silicon carbide, gallium nitride, or gallium arsenide instead of single-crystal silicon. When single-crystal silicon is used as the semiconductor material, arsenic, phosphorus, or antimony is used as an n-type impurity. Boron is used as a p-type impurity. The gate electrode 10 includes a conductive material such as polysilicon, etc. The gate insulating layer 11 and the insulating layer 12 include insulating materials such as silicon oxide, silicon nitride, silicon oxynitride, etc. The lower electrode 21 and the upper electrode 22 include metals such as aluminum, titanium, copper, etc.

FIGS. 5A, 5B, 6A, 6B, 7A, 7B, 8A, and 8B are cross-sectional views showing a method for manufacturing the semiconductor device according to the embodiment.

Figure 5A:
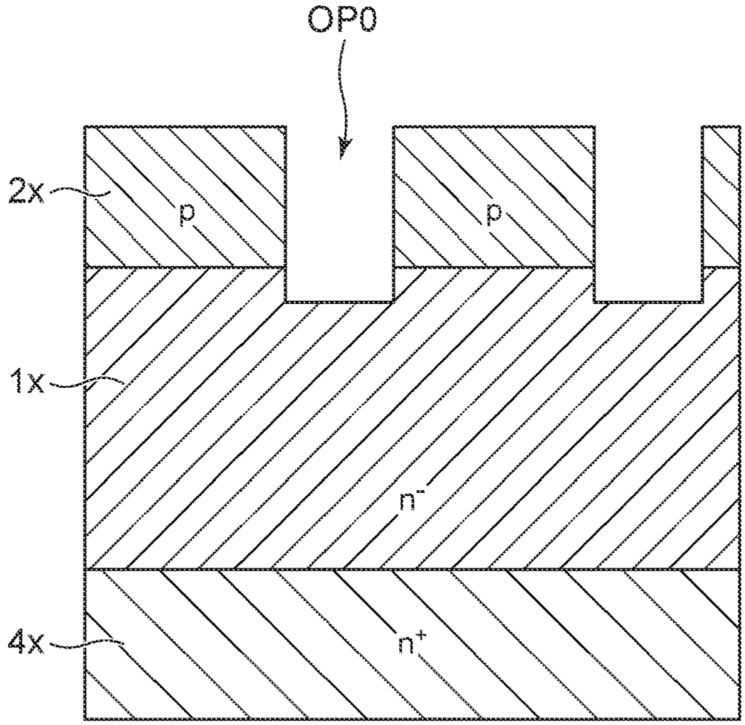
FIGS. 5A and 5B are cross-sectional views showing a method for manufacturing the semiconductor device according to the embodiment.

First, a semiconductor substrate that includes an $n^-$-type semiconductor region 1*x* and an $n^+$-type semiconductor region 4*x* is prepared. The $n^-$-type semiconductor region 1*x* is positioned on the $n^+$-type semiconductor region 4*x*. The n-type impurity concentration in the $n^-$-type semiconductor region 1*x* is less than the n-type impurity concentration in the $n^+$-type semiconductor region 4*x*. A p-type semiconductor region 2*x* is formed by ion-implanting a p-type impurity into the upper surface of the $n^-$-type semiconductor region 1*x*. A portion of the p-type semiconductor region 2*x* and a portion of the $n^-$-type semiconductor region 1*x* are removed by reactive ion etching (RIE). As a result, openings OP0 that extend in the Y-direction are formed as shown in FIG. 5A.

Figure 5B:
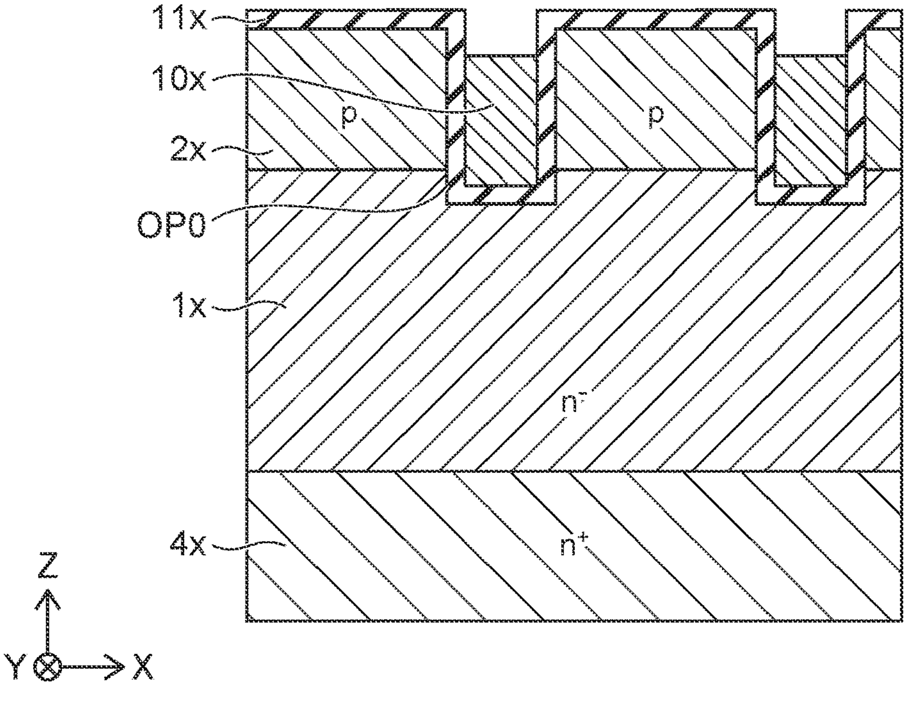

An insulating layer 11*x* is formed along the surface of the $n^-$-type semiconductor region 1*x* and the surface of the p-type semiconductor region 2*x* by thermal oxidation. A conductive layer 10*x* is formed on the insulating layer 11*x* by chemical vapor deposition (CVD). The openings OP0 are filled with the conductive layer 10*x*. The upper surface of the conductive layer 10*x* is caused to recede by chemical mechanical polishing (CMP) and wet etching. As a result, as shown in FIG. 5B, the multiple conductive layers 10*x* that are separated from each other are formed respectively inside the multiple openings OP0.

An $n^+$-type semiconductor region 3*x* is formed by ion-implanting an n-type impurity into the upper surface of the p-type semiconductor region 2*x*. An insulating layer 12*x* is formed on the conductive layer 10*x* and the insulating layer 11*x* by CVD. A portion of the insulating layer 12*x* and a portion of the insulating layer 11*x* are removed by RIE. An opening OP1 is formed thereby. A portion of the $n^+$-type semiconductor region 3*x* is exposed via the opening OP1.

Figure 6A:
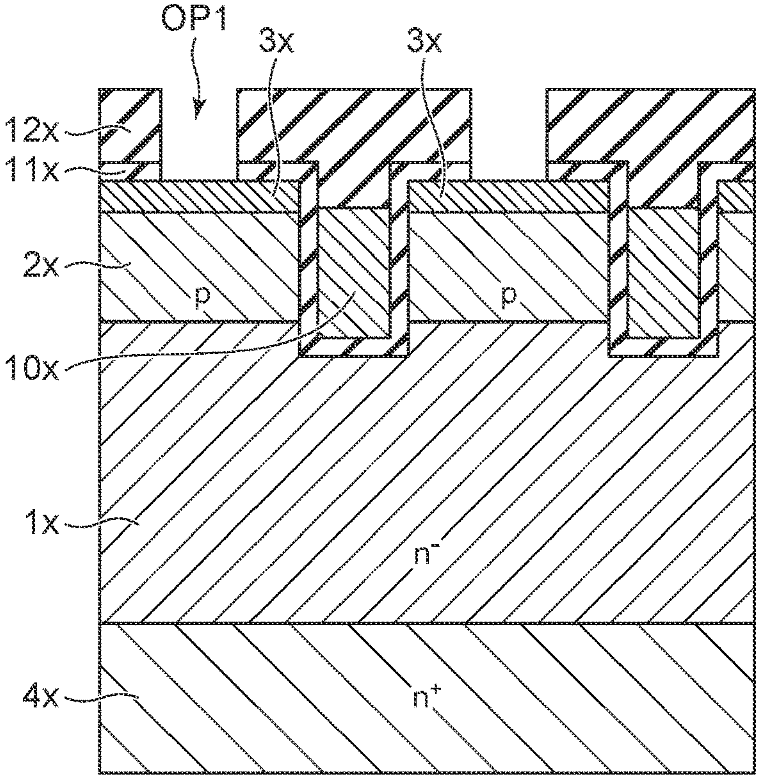
FIGS. 6A and 6B are cross-sectional views showing a method for manufacturing the semiconductor device according to the embodiment.

As shown in FIG. 6A, a structure body that includes the $n^-$-type semiconductor region 1*x*, the p-type semiconductor region 2*x*, the $n^+$-type semiconductor region 3*x*, the conductive layer 10*x*, the insulating layer 11*x*, and the insulating layer 12*x* is made by the processes up to this point. The direction from the $n^-$-type semiconductor region 1*x* toward the conductive layer 10*x* is parallel to the Z-direction. The p-type semiconductor region 2*x* faces the conductive layer 10*x* via the insulating layer 11*x* in the X-direction.

Figure 6B:
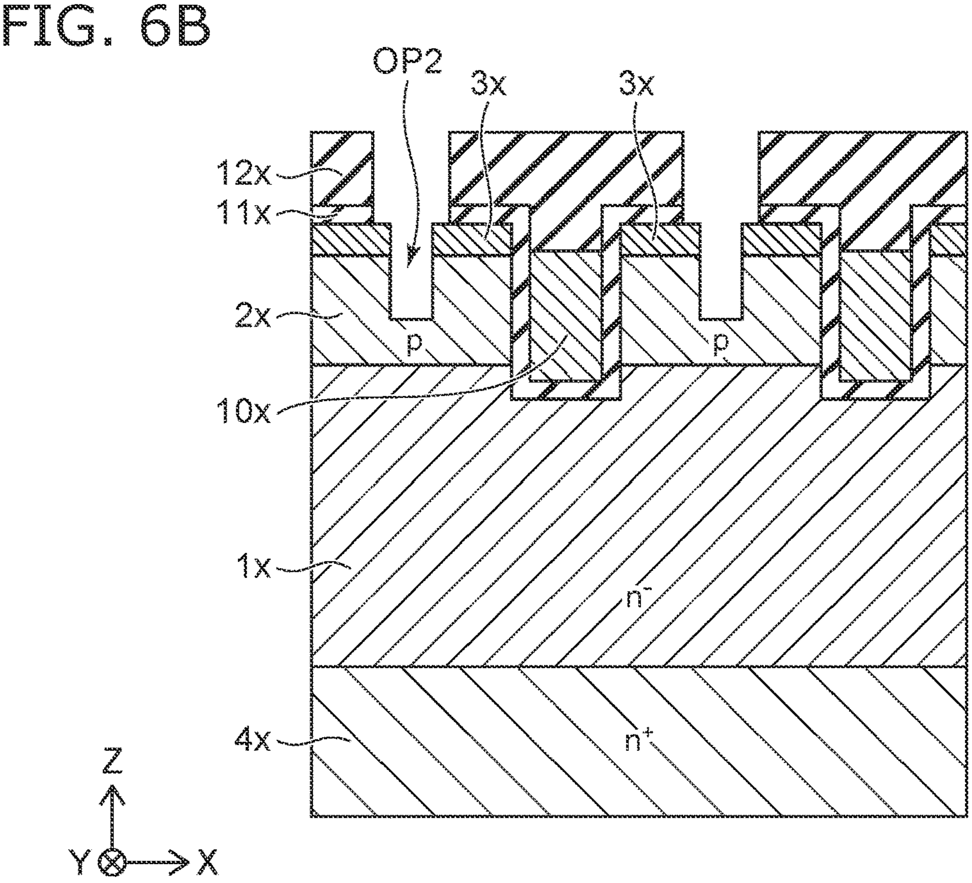

A portion of the $n^+$-type semiconductor region 3*x* and a portion of the p-type semiconductor region 2*x* are removed by RIE via the opening OP1. As shown in FIG. 6B, an opening OP2 is formed thereby. The opening OP2 is positioned between the conductive layers 10*x* adjacent to each other in the X-direction.

Figure 7A:
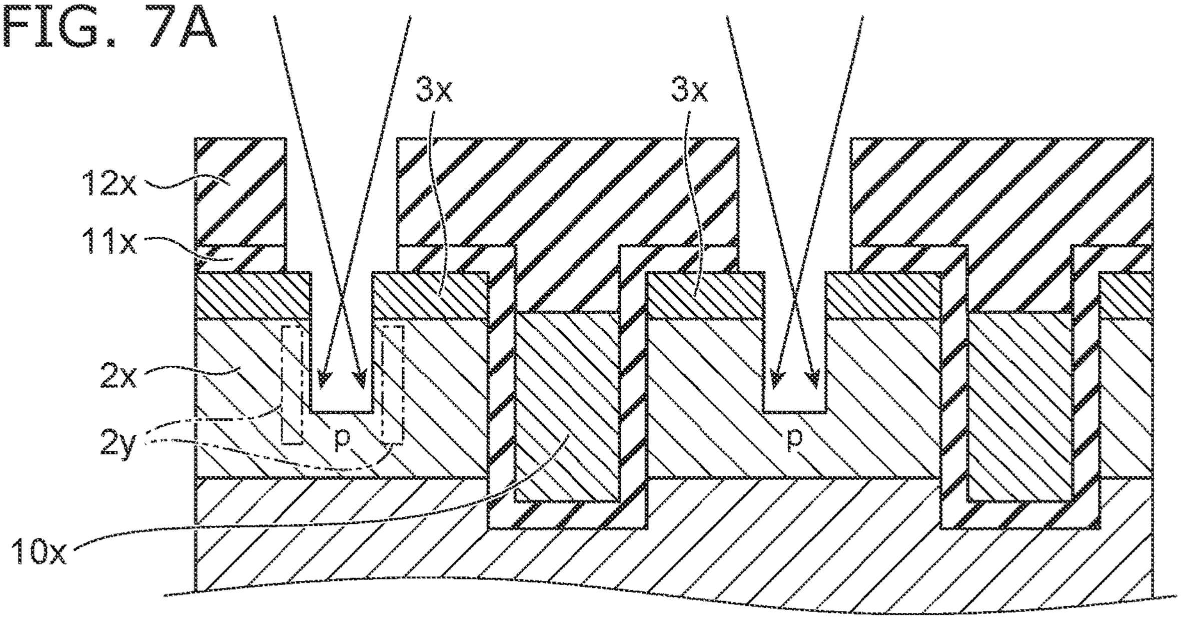
FIGS. 7A and 7B are cross-sectional views showing a method for manufacturing the semiconductor device according to the embodiment.

As shown in FIG. 7A, an element is ion-implanted into the p-type semiconductor region 2*x* via the opening OP2 at a first angle with respect to the Z-direction. The implanted element is at least one selected from the group consisting of carbon, germanium, antimony, indium, argon, and silicon. As a result, the element is implanted into a region 2*y* positioned at the side surface of the opening OP2 and the corners of the bottom portion of the opening OP2.

Figure 7B:
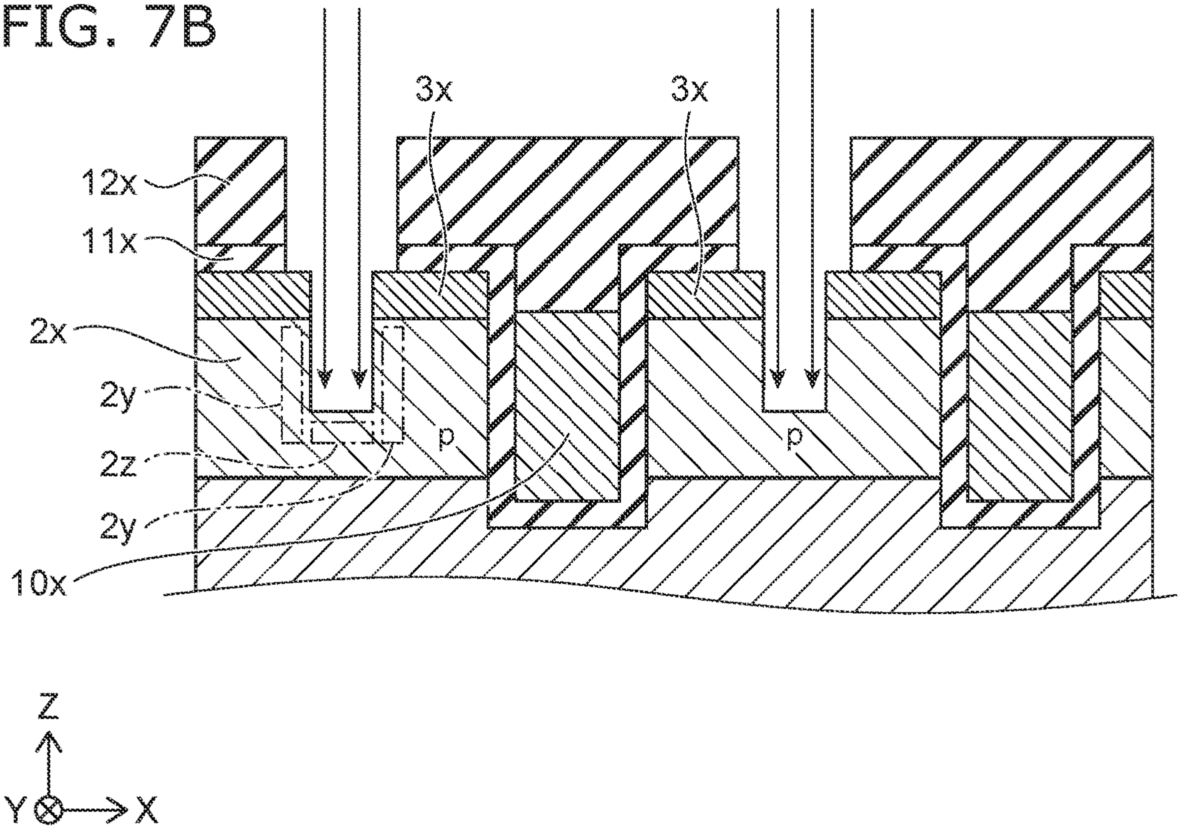

As shown in FIG. 7B, a p-type impurity is ion-implanted into the p-type semiconductor region 2*x* via the opening OP2 at a second angle with respect to the Z-direction. The second angle is less than the first angle. As a result, the p-type impurity is implanted into a region 2*z* positioned at the bottom portion of the opening OP2. The n-type impurity and the p-type impurity that are implanted up to this point are activated by heat treatment.

As an example, the aspect ratio of the opening OP2 is not less than 2 and not more than 3 in the processes shown in FIGS. 7A and 7B. The aspect ratio is the ratio of the dimension in the Z-direction of the opening OP2 to the dimension in the X-direction of the opening OP2. In such a case, the first angle in the X-Z plane with respect to the Z-direction is set to be not less than 9 degrees and not more than 22 degrees. The second angle in the X-Z plane with respect to the Z-direction is set to be not less than 0 degrees and not more than 7 degrees.

Figure 8A:
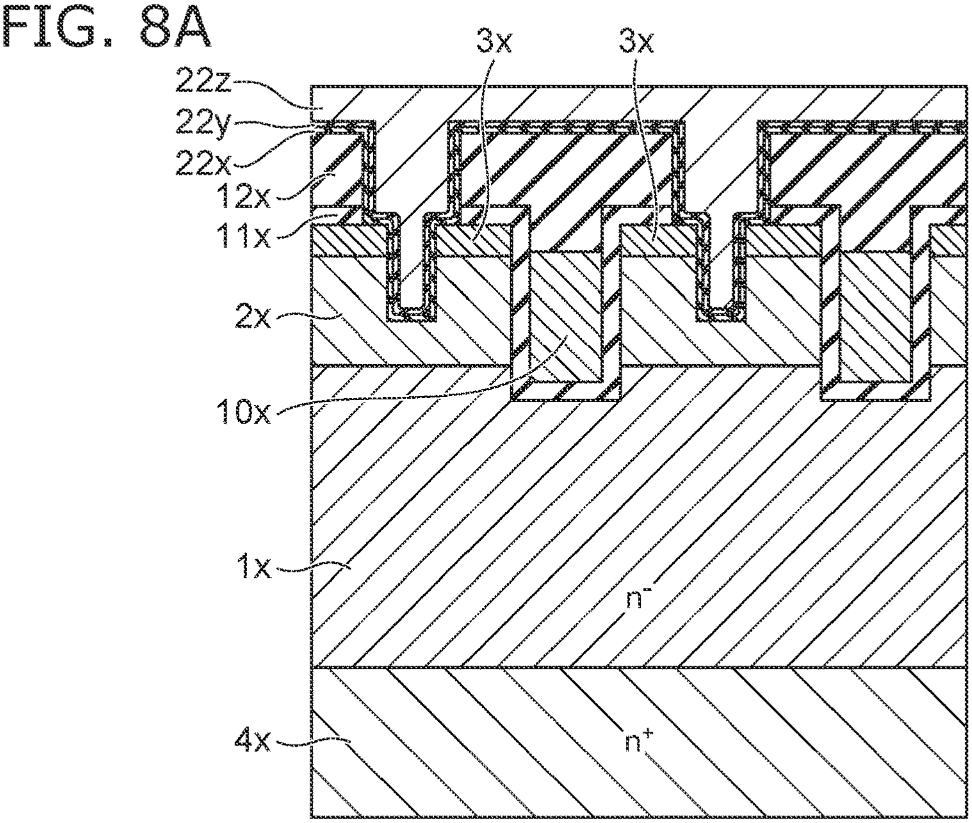
FIGS. 8A and 8B are cross-sectional views showing a method for manufacturing the semiconductor device according to the embodiment.

As shown in FIG. 8A, metal layers 22*x* to 22*z* are sequentially formed by sputtering. The metal layer 22*y* is formed on the metal layer 22*x*. The metal layer 22*z* is formed on the metal layer 22*y*. The metal layer 22*x* includes titanium nitride. The metal layer 22*y* includes titanium. The metal layer 22*z* includes aluminum.

Figure 8B:
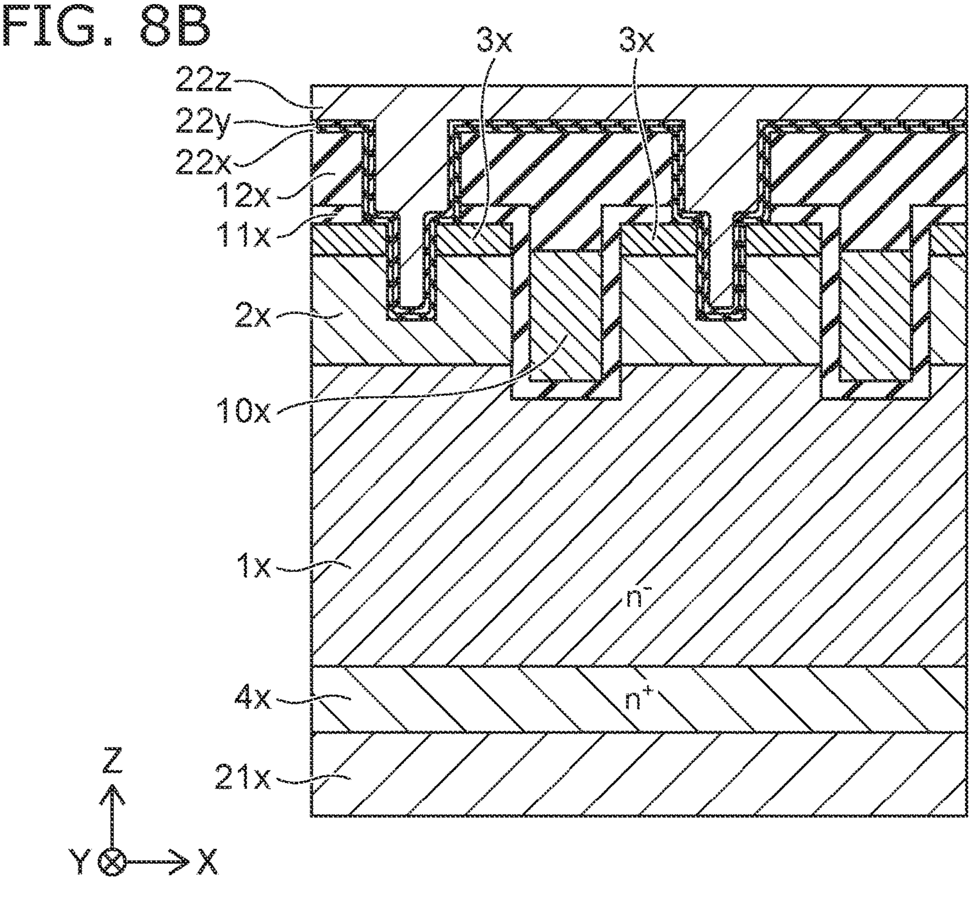

The lower surface of the $n^+$-type semiconductor region 4*x* is polished until the $n^+$-type semiconductor region 4*x* has a prescribed thickness. A metal layer 21*x* is formed at the lower surface of the $n^+$-type semiconductor region 4*x* by sputtering. The metal layer 21*x* includes aluminum. As shown in FIG. 8B, the semiconductor device 100 is manufactured by the processes described above.

Advantages of the embodiment will now be described.

As shown in FIG. 2, it is favorable for the p-type base region 2 to include the second portion 2*b*. By including the second portion 2*b* that has a higher p-type impurity concentration, the electrical resistance between the p-type base region 2 and the contact part 22*a* can be reduced. As shown in FIG. 7B, the second portion 2*b* is formed by ion-implanting a p-type impurity and performing heat treatment. The p-type impurity is diffused when the heat treatment is performed. If the p-type impurity concentration at the gate insulating layer 11 vicinity increases due to this diffusion, the threshold of the voltage of the gate electrode 10 fluctuates.

In particular, it is desirable to form more gate electrodes 10 per unit area in the semiconductor device 100. By increasing the number of the gate electrodes 10 per unit area, the number of channels per unit area can be increased, and the on-resistance of the semiconductor device 100 can be reduced. On the other hand, when the number of the gate electrodes 10 is increased, the spacing between the gate electrodes 10 decreases. Also, the X-direction distance between the gate electrode 10 and the contact part 22*a* decreases. As a result, the effects of the diffusion of the p-type impurity on the threshold of the gate electrode 10 increase. For example, the fluctuation of the turn-on threshold voltage between the semiconductor devices increases.

For this problem, according to the embodiment, the p-type base region 2 includes the third portion 2*c*. The concentration of the first element in the third portion 2*c* is greater than the concentration of the first element in the second portion 2*b*. In the region into which the first element is implanted, the crystal of the semiconductor material is damaged, and at least a portion of this region becomes amorphous. When the p-type impurity diffuses, the p-type impurity accumulates more easily in amorphous regions than in crystalline regions. By providing the third portion 2*c* between the second portion 2*b* and the gate insulating layer 11, the p-type impurity that diffuses toward the gate insulating layer 11 easily accumulates in the third portion 2*c*. As a result, the diffusion of the p-type impurity toward the gate insulating layer 11 can be suppressed, and the fluctuation of the threshold of the gate electrode 10 can be suppressed.

The first element is at least one selected from the group consisting of carbon, germanium, antimony, and indium. These elements are easy to ion-implant, and have atomic radii sufficient to damage the silicon crystal lattice. Also, the effects on the operations of the semiconductor device 100 are small. According to the semiconductor device 100, the diffusion of the p-type impurity in the Z-direction is not suppressed. Therefore, the second portion 2*b* can be formed to have a sufficiently large Z-direction thickness. The electrical resistance between the p-type base region 2 and the contact part 22*a* can be sufficiently reduced.

According to the embodiment, the fluctuation of the threshold of the gate electrode 10 can be suppressed while suppressing a reduction of the Z-direction thickness of the second portion 2*b*.

By including the third portion 2*c*, a concentration distribution difference is obtained in the p-type base region 2 between the p-type impurity concentration distribution in the X-direction from the second portion 2*b* toward the gate insulating layer 11 and the p-type impurity concentration distribution in the Z-direction from the second portion 2*b* toward the first portion 2*a*. Generally, the diffusion distance of a p-type impurity in a semiconductor region is constant regardless of the direction. In contrast, by including the third portion 2*c* in the semiconductor device 100, the diffusion distance of the p-type impurity in the X-direction is less than the diffusion distance of the p-type impurity in the Z-direction. As a result, as shown in FIGS. 3 and 4, the length L1 of the first region r1 is less than 0.5 times the length L2 of the second region r2.

Favorably, the concentration of the first element in the third portion 2*c* is greater than $3.0\times10^{17}$ atoms/cm$^3$. By setting the concentration of the first element to be greater than $3.0\times10^{17}$ atoms/cm$^3$, the diffusion of the p-type impurity can be effectively suppressed by the third portion 2*c*. On the other hand, when the concentration of the first element in the third portion 2*c* is excessively high, there is a possibility that the operations of the semiconductor device 100 may become unstable. It is therefore favorable for the concentration of the first element in the third portion 2*c* to be less than $5.0\times10^{20}$ atoms/cm$^3$.

In particular, it is favorable for the first element to be at least one selected from the group consisting of carbon and germanium. Carbon and germanium are Group 4 elements, and are electrically neutral. Even when carbon and germanium are included in the p-type base region 2, these elements substantially do not affect the operations of the semiconductor device 100.

Other than carbon, germanium, antimony, and indium, according to the manufacturing method according to the embodiment, argon or silicon may be ion-implanted into the p-type semiconductor region 2*x* when performing the process shown in FIG. 7A. The crystallinity of the region of the p-type semiconductor region 2*x* into which argon or silicon are ion-implanted is damaged; and at least a portion of this region becomes amorphous. Diffusion of the p-type impurity in subsequent heat treatment processes is suppressed by this region.

Figure 9:
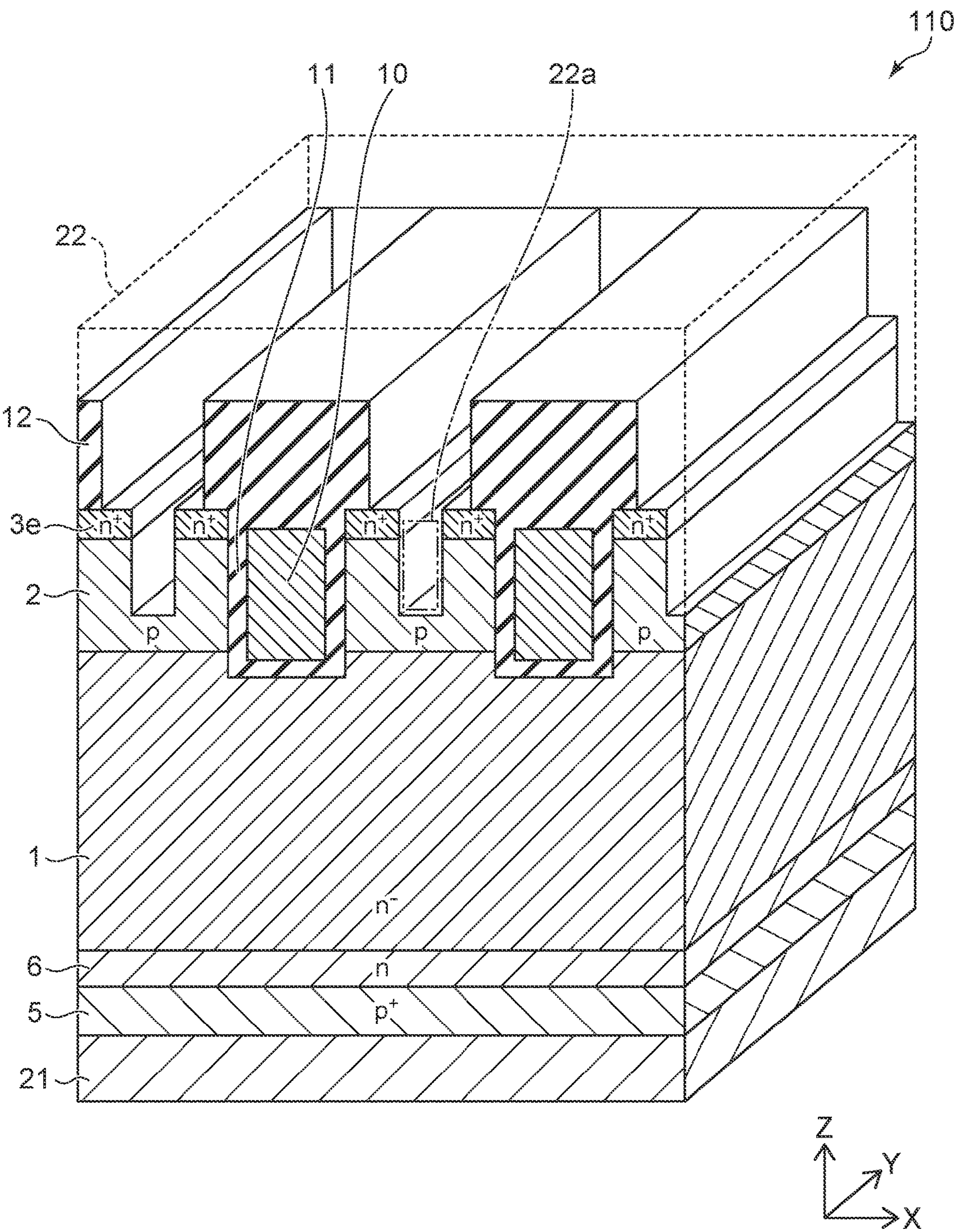
FIG. 9 is a perspective cross-sectional view showing a portion of another semiconductor device according to the embodiment.

FIG. 9 is a perspective cross-sectional view showing a portion of another semiconductor device according to the embodiment.

The semiconductor device 110 shown in FIG. 9 is an IGBT. Compared with the semiconductor device 100, the semiconductor device 110 includes a $p^+$-type collector region 5 and an n-type buffer region 6 instead of the $n^+$-type drain region 4. The $n^+$-type source region 3 functions as an $n^+$-type emitter region 3*e*. The $p^+$-type collector region 5 is located on the lower electrode 21, and is electrically connected with the lower electrode 21. The n-type buffer region 6 is located between the $p^+$-type collector region 5 and the $n^-$-type drift region 1. The n-type impurity concentration in the n-type buffer region 6 is greater than the n-type impurity concentration in the $n^-$-type drift region 1.

When a voltage that is not less than a threshold is applied to the gate electrode 10 in a state in which a positive voltage with respect to the upper electrode 22 is applied to the lower electrode 21, the semiconductor device 110 is set to the on-state. At this time, a channel (an inversion layer) is formed at the gate insulating layer 11 vicinity of the p-type base region 2. Electrons are injected from the $n^+$-type emitter region 3*e* into the $n^-$-type drift region 1 via the channel. Holes are injected from the collector region 5 into the $n^-$-type drift region 1. Conductivity modulation occurs in the $n^-$-type drift region 1; and the electrical resistance in the $n^-$-type drift region 1 decreases. Subsequently, when the voltage applied to the gate electrode 10 drops below the threshold, the channel in the p-type base region 2 disappears, and the semiconductor device 110 is set to the off-state.

In the semiconductor device 110 as well, by including the third portion 2*c* in the p-type base region 2, the diffusion of the p-type impurity from the second portion 2*b* toward the gate insulating layer 11 can be suppressed. As a result, the fluctuation of the threshold of the gate electrode 10 can be suppressed while suppressing a reduction of the Z-direction thickness of the second portion 2*b*.

The embodiments may include the following features.

(Feature 1)

A semiconductor device, comprising:
- a first electrode;
- a first semiconductor region located on the first electrode, the first semiconductor region being electrically connected with the first electrode, the first semiconductor region being of a first conductivity type;
- a gate electrode located on the first semiconductor region with a gate insulating layer interposed;
- a second semiconductor region facing the gate electrode via the gate insulating layer in a second direction perpendicular to a first direction, the first direction being from the first electrode toward the first semiconductor region, the second semiconductor region being of a second conductivity type, the second semiconductor region including
  - a first portion,
  - a second portion located on the first portion, the second portion having a higher second-conductivity-type impurity concentration than the first portion, and
  - a third portion positioned between the second portion and the gate electrode in the second direction, the third portion having a higher concentration of a first element than the second portion, the first element being at least one selected from the group consisting of carbon, germanium, antimony, and indium;
- a third semiconductor region located on the second semiconductor region, the third semiconductor region being of the first conductivity type; and
- a second electrode electrically connected with the second and third semiconductor regions, the second electrode including a contact part arranged with the third semiconductor region in the second direction and located on the second portion.

(Feature 2)

The device according to Feature 1, wherein the concentration of the first element in the third portion is greater than $3.0 \times 10^{17}$ atoms/$cm^3$ and less than $5.0 \times 10^{20}$ atoms/$cm^3$.

(Feature 3)

The device according to Feature 1 or 2, wherein the second semiconductor region further includes a fourth portion arranged with the contact part in the second direction, and a concentration of the first element in the fourth portion is greater than the concentration of the first element in the second portion.

(Feature 4)

The device according to any one of Features 1 to 3, wherein the second semiconductor region is located between a pair of the gate electrodes adjacent to each other in the second direction, the second semiconductor region includes a pair of the third portions, and the second portion is positioned between the pair of third portions in the second direction.

(Feature 5)

The device according to any one of Features 1 to 4, wherein the first element is carbon or germanium.

(Feature 6)

A semiconductor device, comprising:

a first electrode;

a first semiconductor region located on the first electrode, the first semiconductor region being electrically connected with the first electrode, the first semiconductor region being of a first conductivity type;

a gate electrode located on the first semiconductor region with a gate insulating layer interposed;

a second semiconductor region facing the gate electrode via the gate insulating layer in a second direction perpendicular to a first direction, the first direction being from the first electrode toward the first semiconductor region, the second semiconductor region being of a second conductivity type, the second semiconductor region including a first portion, and a second portion located on the first portion, the second portion having a higher second-conductivity-type impurity concentration than the first portion;

a third semiconductor region located on the second semiconductor region, the third semiconductor region being of the first conductivity type; and a second electrode electrically connected with the second and third semiconductor regions, the second electrode including a contact part arranged with the third semiconductor region in the second direction and located on the second semiconductor region, a length of a first region being less than 0.5 times a length of a second region, the first region being a region in which an impurity concentration of an impurity concentration distribution of the second conductivity type is within a range of 0.1 times to 0.001 times a maximum value of the impurity concentration when the impurity concentration distribution is measured along the second direction from the second portion toward the gate insulating layer, the second region being a region in which the impurity concentration of the impurity concentration distribution is within a range of 0.1 times to 0.001 times a maximum value of the impurity concentration when the impurity concentration distribution is measured along the first direction from an interface between the second portion and the contact part toward the first portion.

(Feature 7)

The device according to Feature 6, wherein a concentration of a first element in the first region is greater than a concentration of the first element in the second region, and the first element is at least one selected from the group consisting of carbon, germanium, antimony, and indium.

(Feature 8)

A method for manufacturing a semiconductor device, the device including a structure body, the structure body including:

a first semiconductor region of a first conductivity type;

a conductive layer located on the first semiconductor region with an insulating layer interposed;

a second semiconductor region facing the conductive layer via the insulating layer in a second direction perpendicular to a first direction, the first direction being from the first semiconductor region toward the conductive layer, the second semiconductor region being of a second conductivity type; and a third semiconductor region located on the second semiconductor region, the third semiconductor region being of the first conductivity type, the method comprising:

forming an opening in the structure body by removing a portion of the second semiconductor region and a portion of the third semiconductor region;

ion-implanting at least one selected from the group consisting of carbon, germanium, antimony, indium, argon, and silicon into the second semiconductor region via the opening at a first angle with respect to the first direction; and ion-implanting a second-conductivity-type impurity into the second semiconductor region via the opening at a second angle with respect to the first direction, the second angle being less than the first angle.

While certain embodiments of the inventions have been illustrated, these embodiments have been presented by way of example only, and are not intended to limit the scope of the inventions. These novel embodiments may be embodied in a variety of other forms; and various omissions, substitutions, modifications, etc., can be made without departing from the spirit of the inventions. These embodiments and their modifications are within the scope and spirit of the inventions and are within the scope of the inventions described in the claims and their equivalents. The embodiments described above can be implemented in combination with each other.

What is claimed is:

1. A semiconductor device, comprising:

a first electrode;

a first semiconductor region located on the first electrode, the first semiconductor region being electrically connected with the first electrode, the first semiconductor region being of a first conductivity type;

a gate electrode located on the first semiconductor region with a gate insulating layer interposed;

a second semiconductor region facing the gate electrode via the gate insulating layer in a second direction perpendicular to a first direction, the first direction being from the first electrode toward the first semiconductor region, the second semiconductor region being of a second conductivity type, the second semiconductor region including a first portion, a second portion located on the first portion, the second portion having a higher second-conductivity-type impurity concentration than the first portion, and a third portion positioned between the second portion and the gate electrode in the second direction, the third portion having a higher concentration of a first element than the second portion, the first element being at least one selected from the group consisting of carbon, germanium, antimony, and indium;

a third semiconductor region located on the second semiconductor region, the third semiconductor region being of the first conductivity type; and a second electrode electrically connected with the second and third semiconductor regions, the second electrode including a contact part arranged with the third semiconductor region in the second direction and located on the second portion.

2. The device according to claim 1, wherein the concentration of the first element in the third portion is greater than $3.0\times10^{17}$ atoms/cm$^3$ and less than $5.0\times10^{20}$ atoms/cm$^3$.

3. The device according to claim 1, wherein the second semiconductor region further includes a fourth portion arranged with the contact part in the second direction, and a concentration of the first element in the fourth portion is greater than the concentration of the first element in the second portion.

4. The device according to claim 1, wherein the second semiconductor region is located between a pair of the gate electrodes adjacent to each other in the second direction, the second semiconductor region includes a pair of the third portions, and the second portion is positioned between the pair of third portions in the second direction.

5. The device according to claim 1, wherein the first element is carbon or germanium.

6. A semiconductor device, comprising:

a first electrode;

a first semiconductor region located on the first electrode, the first semiconductor region being electrically connected with the first electrode, the first semiconductor region being of a first conductivity type;

a gate electrode located on the first semiconductor region with a gate insulating layer interposed;

a second semiconductor region facing the gate electrode via the gate insulating layer in a second direction perpendicular to a first direction, the first direction being from the first electrode toward the first semiconductor region, the second semiconductor region being of a second conductivity type, the second semiconductor region including a first portion, and a second portion located on the first portion, the second portion having a higher second-conductivity-type impurity concentration than the first portion;

a third semiconductor region located on the second semiconductor region, the third semiconductor region being of the first conductivity type; and a second electrode electrically connected with the second and third semiconductor regions, the second electrode including a contact part arranged with the third semiconductor region in the second direction and located on the second semiconductor region, a length of a first region being less than 0.5 times a length of a second region, the first region being a region in which an impurity concentration of an impurity concentration distribution of the second conductivity type is within a range of 0.1 times to 0.001 times a maximum value of the impurity concentration when the impurity concentration distribution is measured along the second direction from the second portion toward the gate insulating layer, the second region being a region in which the impurity concentration of the impurity concentration distribution is within a range of 0.1 times to 0.001 times a maximum value of the impurity concentration when the impurity concentration distribution is measured along the first direction from an interface between the second portion and the contact part toward the first portion.

7. The device according to claim 6, wherein a concentration of a first element in the first region is greater than a concentration of the first element in the second region, and the first element is at least one selected from the group consisting of carbon, germanium, antimony, and indium.

8. A method for manufacturing a semiconductor device, the device including a structure body, the structure body including:

a first semiconductor region of a first conductivity type;

a conductive layer located on the first semiconductor region with an insulating layer interposed;

a second semiconductor region facing the conductive layer via the insulating layer in a second direction perpendicular to a first direction, the first direction being from the first semiconductor region toward the conductive layer, the second semiconductor region being of a second conductivity type; and a third semiconductor region located on the second semiconductor region, the third semiconductor region being of the first conductivity type, the method comprising:

forming an opening in the structure body by removing a portion of the second semiconductor region and a portion of the third semiconductor region;

ion-implanting at least one selected from the group consisting of carbon, germanium, antimony, indium, argon, and silicon into the second semiconductor region via the opening at a first angle with respect to the first direction; and ion-implanting a second-conductivity-type impurity into the second semiconductor region via the opening at a second angle with respect to the first direction, the second angle being less than the first angle.

* * * * *